United States Patent
Campbell et al.

(10) Patent No.: US 7,779,775 B2
(45) Date of Patent: Aug. 24, 2010

(54) SCHEDULE INDICATOR

(75) Inventors: Glennbruce S. Campbell, Memphis, TN (US); Eugene Buican, Cordova, TN (US)

(73) Assignee: Hunter Fan Company, Memphis, TN (US)

( * ) Notice: Subject to any disclaimer, the term of this patent is extended or adjusted under 35 U.S.C. 154(b) by 65 days.

(21) Appl. No.: 12/397,528

(22) Filed: Mar. 4, 2009

(65) Prior Publication Data

US 2009/0229511 A1 Sep. 17, 2009

Related U.S. Application Data

(60) Provisional application No. 61/036,499, filed on Mar. 14, 2008.

(51) Int. Cl.
*G01D 13/22* (2006.01)

(52) U.S. Cl. .................. 116/308; 116/300; 116/309; 116/315; 116/316; 96/417; 55/DIG. 34

(58) Field of Classification Search ........... 116/284, 116/290, 294, 295, 298–300, 301, 305–309, 116/311, 312, 315–320, DIG. 1, DIG. 25; 96/417; 55/DIG. 34; 40/493, 495
See application file for complete search history.

(56) References Cited

U.S. PATENT DOCUMENTS

| | | | | |
|---|---|---|---|---|
| 1,689,818 A * | 10/1928 | Dargavel | | 116/308 |
| 3,086,493 A * | 4/1963 | Bullard, III | | 116/231 |
| 3,151,599 A | 10/1964 | Livingston | | 116/308 |
| 3,227,127 A | 1/1966 | Gayle | | 116/308 |
| 3,818,858 A | 6/1974 | Kramer et al. | | 116/133 |
| 4,041,628 A * | 8/1977 | Sasson | | 40/111 |
| 4,528,933 A | 7/1985 | Allen | | 116/308 |
| 4,582,251 A | 4/1986 | Odom, Jr. et al. | | 236/94 |
| 4,753,189 A | 6/1988 | Mastman et al. | | 116/308 |
| 4,886,010 A | 12/1989 | Stutzman | | 116/308 |
| 5,056,454 A | 10/1991 | Turner | | 116/209 |
| 5,184,739 A | 2/1993 | Kusz | | 215/220 |
| 5,303,612 A | 4/1994 | Odom et al. | | 74/553 |
| D350,191 S | 8/1994 | Tsuji | | D23/364 |
| 5,345,838 A | 9/1994 | Howie, Jr. | | 74/553 |
| 5,433,324 A | 7/1995 | Leonard | | 206/534 |
| D370,711 S | 6/1996 | Serenko et al. | | D23/207 |
| 5,564,361 A | 10/1996 | Satterwhite | | 116/308 |
| D395,704 S | 6/1998 | Thomas et al. | | D23/364 |
| 5,769,118 A | 6/1998 | Lenberg | | 137/553 |
| D396,097 S | 7/1998 | Thomas et al. | | D23/364 |

(Continued)

*Primary Examiner*—Amy Cohen Johnson
(74) *Attorney, Agent, or Firm*—Baker Donelson

(57) ABSTRACT

An air purifier (10) is disclosed which includes a housing (11) having a top wall with a schedule indicator (14). The housing top wall has a central recess (16), an annular inner groove (18) positioned concentrically about the central well, and an annular outer groove (20) positioned concentrically about the inner groove. An annular plateau (28) is formed between the inner groove and the outer groove. A first reset ring (31) is positioned within the outer groove for rotational movement therein. The first reset ring includes two inwardly extending timing indicating tabs (32) and (33). A second reset ring (35) is positioned within the inner groove for rotational movement therein. The second reset ring includes two outwardly extending timing indicating tabs or indicators (36) and (37). A knob (43) coupled to a power switch (45) is positioned within the central well for rotational movement therein.

14 Claims, 4 Drawing Sheets

U.S. PATENT DOCUMENTS

| | | | |
|---|---|---|---|
| 5,811,004 A | 9/1998 | Robertson et al. | 210/482 |
| D402,022 S | 12/1998 | Termeer et al. | D23/364 |
| D402,745 S | 12/1998 | Termeer et al. | D23/364 |
| 5,862,737 A | 1/1999 | Chiu et al. | 96/416 |
| 5,893,939 A | 4/1999 | Rakocy et al. | 55/471 |
| 5,967,350 A | 10/1999 | Jones | 215/222 |
| 6,017,375 A | 1/2000 | Duell et al. | 55/356 |
| 6,059,132 A | 5/2000 | Benjamin | 215/206 |
| D451,182 S | 11/2001 | Tsuji | D23/365 |
| 6,315,821 B1 | 11/2001 | Pillion et al. | 96/416 |
| 6,789,497 B1 | 9/2004 | Aiken | 116/308 |
| 6,912,968 B2 | 7/2005 | Carbajal | 116/308 |

* cited by examiner

SCHEDULE INDICATOR

REFERENCE TO RELATED APPLICATION

Applicant claims the benefit of U.S. Provisional Patent Application Ser. No. 61/036,499 filed Mar. 14, 2008.

TECHNICAL FIELD

This invention relates to schedule indicators, and specifically to manual schedule indicators of the type that show when two separate selected elements of a device should be replaced or maintained.

BACKGROUND OF THE INVENTION

Many devices in today's market include elements which must be replaced or maintained periodically in order to provide optimal efficiency. Some of these devices have two separate and distinct elements that may be replaced at different timed intervals or timed periods. Furthermore, even in cases wherein two elements should be replaced at the same time, in actual use, they oftentimes are replaced at different times due to the other factors such as the lack of replacement elements, personnel schedules or the like. In such event, the actual replacement sequence of these two elements may become different, and thus a dual indicator may be desired to indicate the actual replacement time or schedule of each element.

By way of example, air purifiers have grown in popularity in recent years. A growing concern for health and an increased recognition of the risks associated with unclean air are largely responsible for this trend. For example, airborne pollutants can cause or contribute to a number of respiratory problems, including respiratory infections, asthma, and allergies. Additionally, some airborne pollutants can cause undesirable odors.

While air purifiers are available in a wide variety of designs, a conventional air purifier includes a blower that moves air through a filter element. A number of different filter elements with different filtering characteristics are commercially available. For example, particulate filters are available to remove particulate matter from air. A conventional particulate filter includes a substance, such as fiberglass or electret-type media, that traps particulate matter as air is passed therethrough. Another example, odor filters are available to remove odors from the air. A conventional odor filter includes activated carbon, or activated charcoal, which removes pollutants from the air primarily by absorption.

Another form of a filter may include two filter elements of varying filtering capabilities. A pre-filter may be used remove large particulates from the air while a subsequent filter in the air flow removes finer or smaller particulates. As the pre-filter and fine particulate filter may have different useful lives it would be desirous for the air purifier to include an indicator to show the scheduled replacement date for each of the two filters. However, because of limited space available on the face of an air-purifier, the face may not be able to accommodate multiple indicators.

Accordingly, it is seen that a need remains for a schedule indicator that can indicate two separate timing intervals without occupying a large amount of space. It is to the provision of such therefore that the present invention is primarily directed.

SUMMARY OF THE INVENTION

In a preferred form of the invention a schedule indicator comprises a base housing having an first annular recess and a second recess positioned concentrically within the first recess, the first and second recesses defining an annular plateau therebetween having timing indicia thereon indicating specific time periods. A rotatable first condition indicating ring is positioned for rotational movement within the first annular recess, the first condition indicating ring having an inwardly extending first indicator and an inwardly extending second indicator. A rotatable second condition indicating member is positioned for rotational movement within the second annular recess, the second condition indicating member having an outwardly extending third indicator and an outwardly extending fourth indicator. With this construction, the first condition indicating ring is rotated so that the first indicator points to a timing indicia representing a current time period and the second indicator points to a timing indicia representing a first timing event, and the second condition indicating member is rotated so that the third indicator points to the timing indica representing the current time period and the fourth indicator points to a timing indicia representing a second timing event.

DETAILED DESCRIPTION

Figure 1:
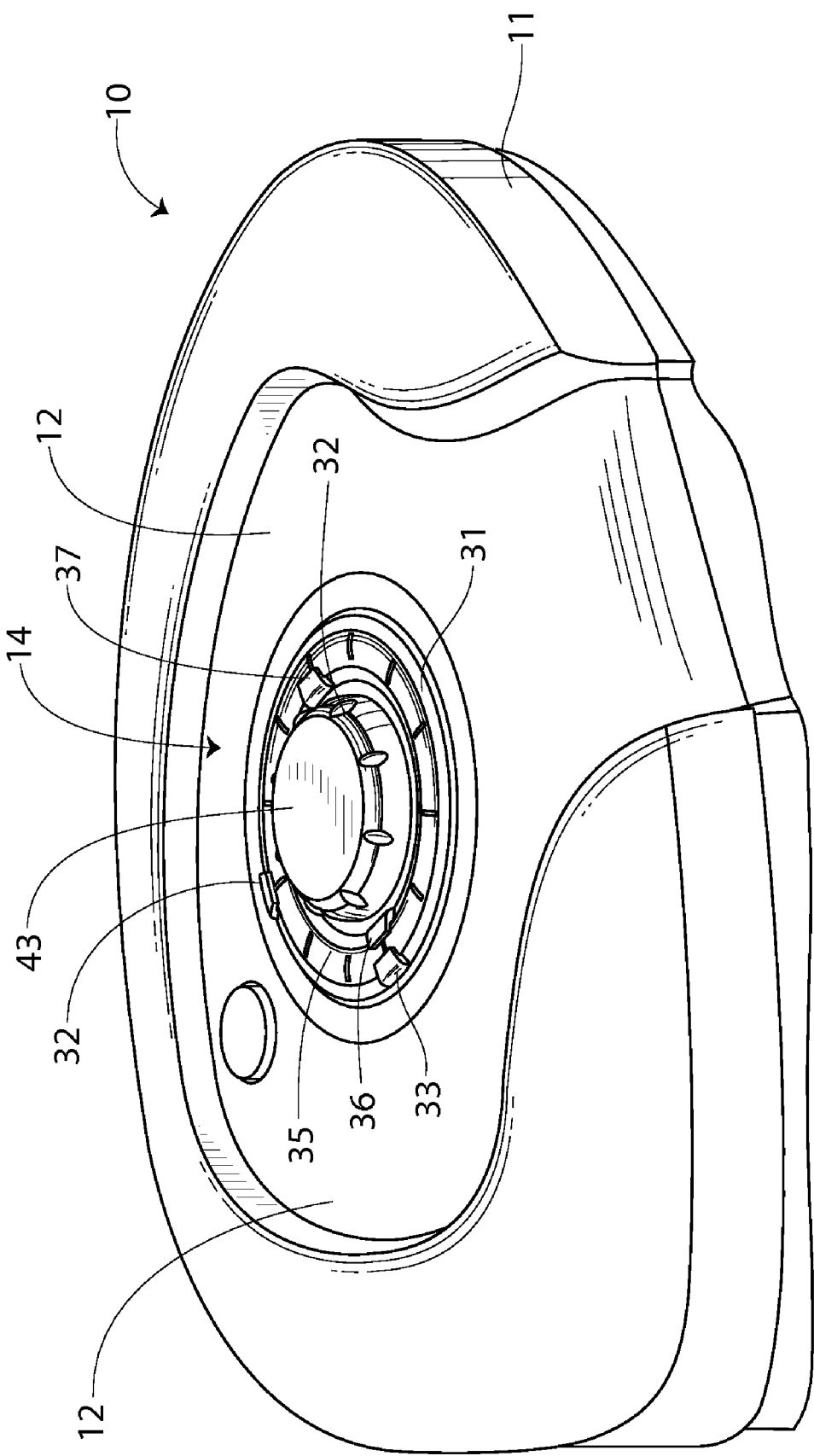
FIG. 1 is a perspective view of an air purifier having a schedule indicator embodying principles of the invention is a preferred form.
Figure 2:
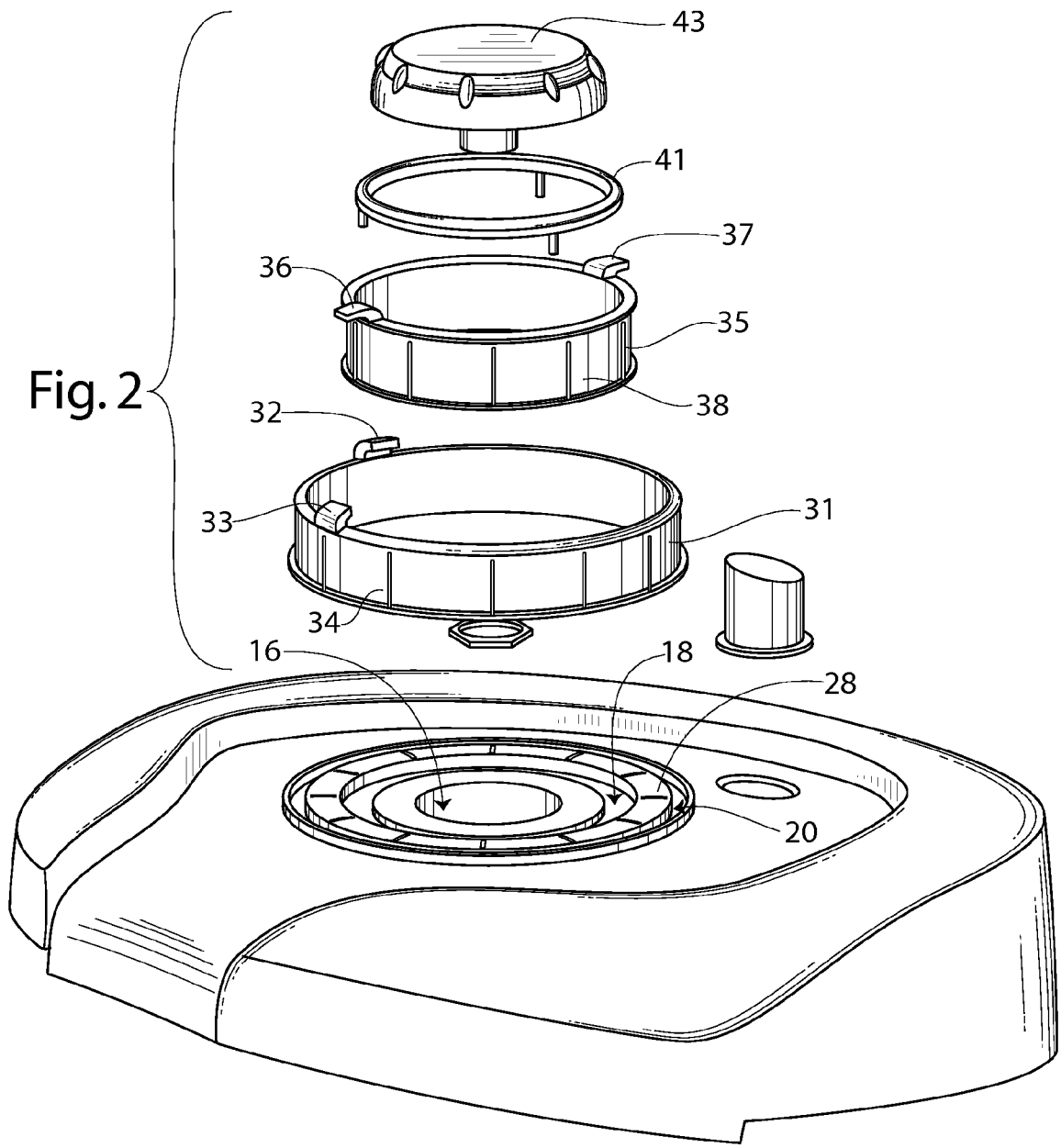
FIG. 2 is an exploded view of the schedule indicator of FIG. 1.
Figure 3:
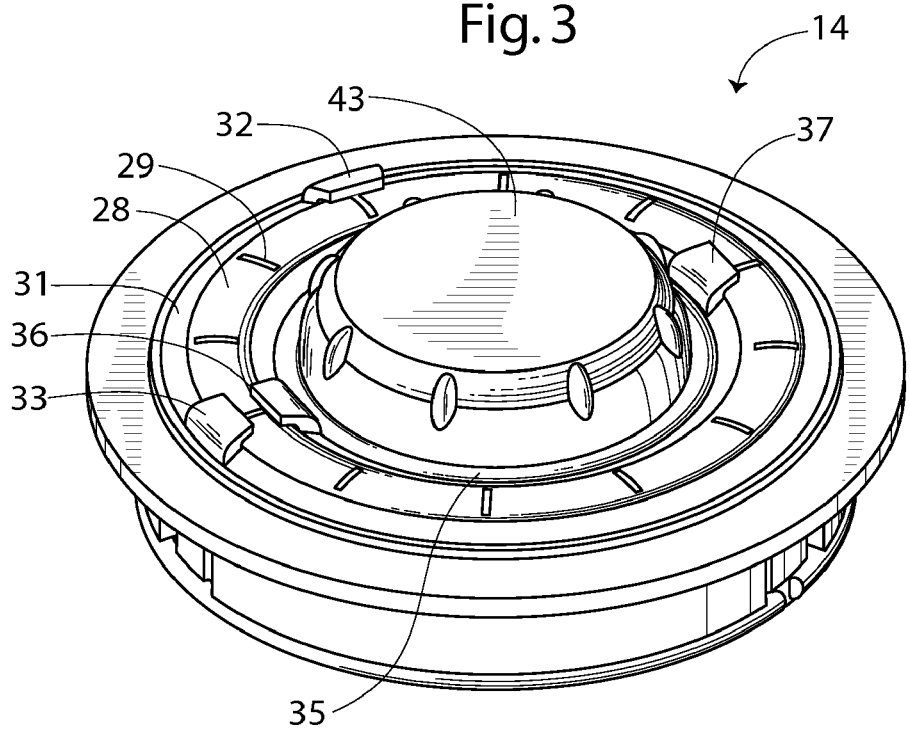
FIG. 3 is a perspective view of the schedule indicator of FIG. 1.
Figure 4:
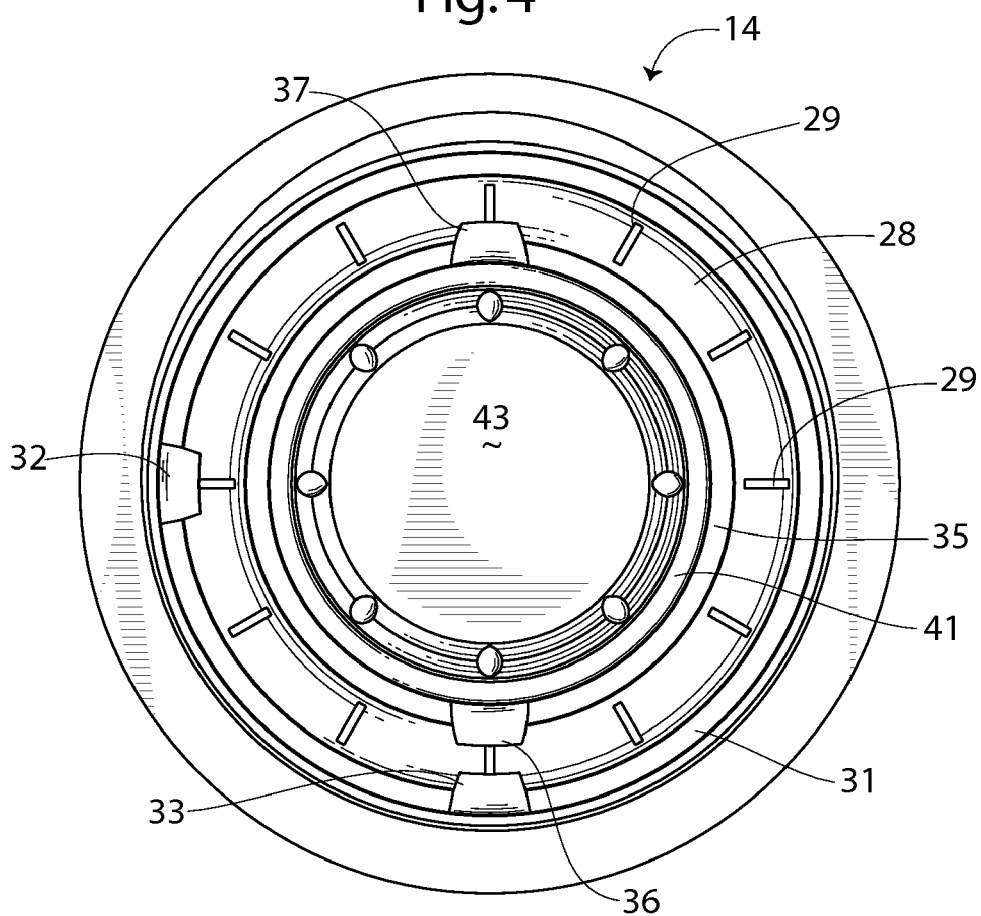
FIG. 4 is a top view of the schedule indicator of FIG. 1.
Figure 5:
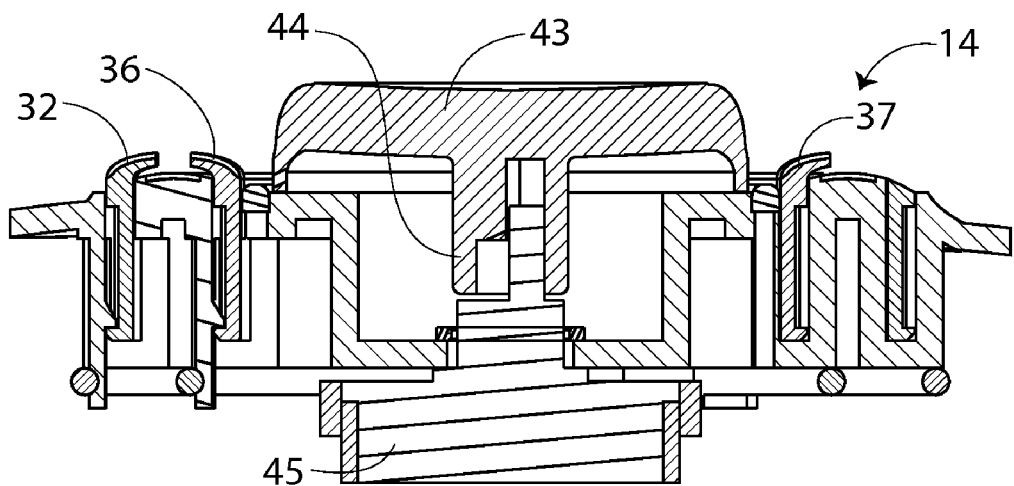
FIG. 5 is a cross-sectional view of the schedule indicator of FIG. 1.
Figure 6:
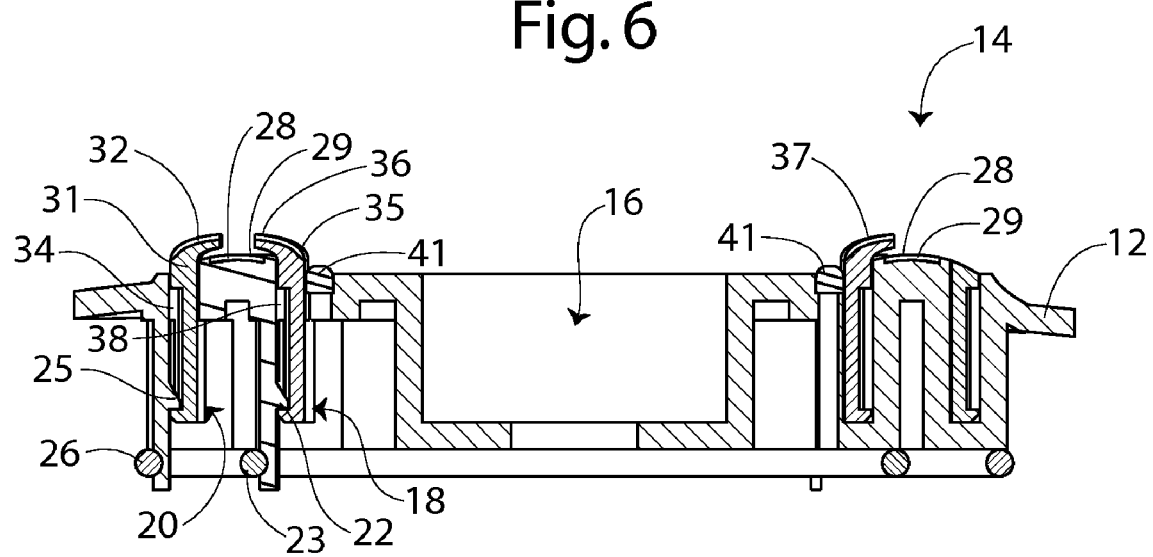
FIG. 6 is a cross-sectional view of a portion of the schedule indicator of FIG. 1

With reference next to the drawings, there is shown an air purifier 10 in the form of a portable, self-standing unit. The air purifier 10 has a housing 11 having a top wall 12 with a schedule indicator 14 in a preferred form of the invention, the portion of the housing adjacent the schedule indicator may be considered a housing base. The air purifier 10 has an unshown pre-filter and an unshown fine particulate pre-filter, such as a HEPA filter within the housing, which should be replaced or maintained periodically according to the useful life of each filter.

The housing top wall 12 has a central recess or well 16, an annular inner groove 18 positioned concentrically about the central well 16, and an annular outer groove 20 positioned concentrically about the inner groove 18. The inner groove 18 includes at least one inwardly extending retaining feature or detent 22 and a compression spring 23 mounted opposite the detent 22 so as to force the detent 22 inwardly. The outer groove 20 similarly includes at least one inwardly extending retaining feature or detent 25 and a compression spring 26 mounted opposite the detent 25 so as to force the detent 25 inwardly. An annular plateau or raised ring 28 is formed between the inner groove 18 and the outer groove 20, the term plateau is intended to indicated a raised structure extending upwardly from the floor of the adjacent grooves. The annular plateau 28 includes an annular array of radially extending top grooves 29 or other indicia indicating a timing period, for example the twelve months of a year.

A first reset ring 31 is positioned within the outer groove 20 for rotational movement therein. The first reset ring 31 includes two inwardly extending timing indicating tabs or indicators 32 and 33 extending from the top surface of the first reset ring. The first reset ring 31 also includes an array of vertical grooves 34 extending from the outboard surface of the first reset ring. The vertical grooves 34 are configured to releasably engage detent 25.

A second reset ring 35 is positioned within the inner groove 18 for rotational movement therein. The second reset ring 35 includes two outwardly extending timing indicating tabs or indicators 36 and 37 extending from the top surface of the second reset ring. The second reset ring 35 also includes an array of vertical grooves 38 extending from the outboard surface of the second reset ring. The vertical grooves 38 are configured to releasably engage detent 22.

An annular light pipe 41 is mounted inboard the second reset ring 35 and coupled to a light generating means to illuminate the light pipe during use. The light pipe enables one to view the schedule indicator in low light conditions.

A knob 43 is positioned within the central well 16 for rotational movement therein. The knob 43 includes a stem 44 extending into a central hole in the well 16. The stem 44 is coupled to a power switch 45. The rotation of the knob 43 actuates the power switch 45 so that the fan turns on and is manually controlled in three various fan speeds.

In use, depending upon the use associated with each reset ring 31 and 35, each ring's timing indicating tabs are set from each other a select distance coinciding with the particular use associated therewith (timing event). For example, the first ring's timing indicating tabs 32 and 33 may be associated with an air purifier's pre-filter and thus they are set ninety degrees from each other, the timing event being the replacement time for the pre-filter. With the plateau 28 having twelve top grooves or other indicia, corresponding to time specific periods such as the twelve months of the year, the ninety degree difference corresponds to three months between a first tab 32 indicating a start or installation date and the second tab 33 indicating an end or replacement date (timing event) for a typical pre-filter. As such, one can readily see when the pre-filter was last installed and when it needs to be replaced. Similarly, the second reset ring's timing indicating tabs 36 and 37 may be associated with an air purifier's main filter and thus they are set one hundred and eighty degrees from each other. Here, the one hundred and eighty degree difference corresponds to six months between the first tab 36 indicating a start date and the second tab 37 indicating an end date for a typical filter (second timing event). Again, one can readily see when the main filter was last installed and when it needs to be replaced.

The first reset ring 31 may be manually rotated so that the first tab 32 aligns with the current month reflected upon the plateau top groove 29. The first reset ring 31 is maintained in its selected position by the positioning of detent 25 within the vertical groove 34 of the first reset ring 31. The spring 26 aids in maintaining a constant inward pressure upon the detent 25 to insure the seating within the groove 29.

The second reset ring 35 may be manually rotated so that the first tab 36 aligns with the current month reflected upon the plateau top groove 29. The second reset ring 35 is maintained in its selected position by the positioning of detent 22 within the vertical groove 38 of the inner ring 35. The spring 23 aids in maintaining a constant inward pressure upon the detent 22 to insure the seating within the groove 38.

It thus is seen that a schedule indicator is now provided that can clearly indicates both the start and end date of two distinct timing periods or requirements.

It should be understood that the schedule indicator may be designed with the second reset ring 35 as a rotatable knob or the like member. Here the previously described knob 43 would be moved elsewhere upon the housing.

It should also be understood that the tabs of the inner and outer rings may be in the form of indicators or indicia upon the rings themselves rather that portions physically extending beyond the periphery of the rings.

It thus is seen that a schedule indicator which can maintain the maintenance schedule of two different items is now provided which overcomes problems with the prior art. While this invention has been described in detail with particular references to the preferred embodiments thereof, it should be understood that many modifications, additions and deletions, in addition to those expressly recited, may be made thereto without departure from the spirit and scope of the invention as described by the following claims.

The invention claimed is:

1. A schedule indicator comprising,
a base housing having an first annular recess and a second recess positioned concentrically within said first recess, said first and second recesses defining an annular plateau therebetween having timing indicia thereon indicating specific time periods;
a rotatable first condition indicating ring positioned for rotational movement within said first annular recess, said first condition indicating ring having an inwardly extending first indicator and an inwardly extending second indicator;
a rotatable second condition indicating member positioned for rotational movement within said second annular recess, said second condition indicating member having an outwardly extending third indicator and an outwardly extending fourth indicator;
whereby the first condition indicating ring is rotated so that the first indicator points to a timing indicia representing a current time period and the second indicator points to a timing indicia representing a first timing event, and whereby the second condition indicating member is rotated so that the third indicator points to the timing indica representing the current time period and the fourth indicator points to a timing indicia representing a second timing event.

2. The schedule indicator of claim 1 wherein said second condition indicating member is a ring.

3. The schedule indicator of claim 1 wherein said first condition indicating ring has a radial array of peripheral grooves and said base housing includes a first detent configured to releasably engage said first condition indicating ring peripheral grooves.

4. The schedule indicator of claim 3 wherein said second condition indicating member has a radial array of peripheral grooves and said base housing includes a second detent configured to releasably engage said second condition indicating member peripheral grooves.

5. The schedule indicator of claim 1 wherein said second condition indicating member has a radial array of peripheral grooves and said base housing includes a second detent configured to releasably engage said second condition indicating member peripheral grooves.

6. The schedule indicator of claim 1 wherein said first condition indicating ring first and second indicators are inwardly extending tabs.

7. The schedule indicator of claim 6 wherein said second condition indicating member third and fourth indicators are outwardly extending tabs.

8. A schedule indicator comprising,
- a base housing having an elevated annular plateau with a top surface having timing indicia thereon indicating specific time periods;
- a rotatable first condition indicating ring positioned for rotational movement about said plateau, said first condition indicating ring having an inwardly extending first indicator and an inwardly extending second indicator;
- a rotatable second condition indicating member positioned for rotational movement within and adjacent said plateau, said second condition indicating member having an outwardly extending third indicator and an outwardly extending fourth indicator;
- whereby the first condition indicating ring is rotated so that the first indicator points to a timing indicia representing a current time period and the second indicator points to a timing indicia representing a first timing event, and whereby the second condition indicating member is rotated so that the third indicator points to the timing indica representing the current time period and the fourth indicator points to a timing indicia representing a second timing event.

9. The schedule indicator of claim 8 wherein said second condition indicating member is a ring.

10. The schedule indicator of claim 8 wherein said first condition indicating ring has a radial array of peripheral grooves and said base housing includes a first detent configured to releasably engage said first condition indicating ring peripheral grooves.

11. The schedule indicator of claim 10 wherein said second condition indicating member has a radial array of peripheral grooves and said base housing includes a second detent configured to releasably engage said second condition indicating member peripheral grooves.

12. The schedule indicator of claim 8 wherein said second condition indicating member has a radial array of peripheral grooves and said base housing includes a second detent configured to releasably engage said second condition indicating member peripheral grooves.

13. The schedule indicator of claim 8 wherein said first condition indicating ring first and second indicators are inwardly extending tabs.

14. The schedule indicator of claim 13 wherein said second condition indicating member third and fourth indicators are outwardly extending tabs.

* * * * *